US009092056B2

(12) United States Patent
Myers et al.

(10) Patent No.: US 9,092,056 B2
(45) Date of Patent: Jul. 28, 2015

(54) KEYBOARD HAVING SELECTIVELY VIEWABLE GLYPHS

(75) Inventors: Stephen Myers, Redwood City, CA (US); Luca Rigazio, San Jose, CA (US)

(73) Assignee: Panasonic Corporation of North America, Secusus, NJ (US)

( * ) Notice: Subject to any disclaimer, the term of this patent is extended or adjusted under 35 U.S.C. 154(b) by 434 days.

(21) Appl. No.: 12/710,230

(22) Filed: Feb. 22, 2010

(65) Prior Publication Data

US 2011/0205161 A1    Aug. 25, 2011

(51) Int. Cl.
*G06F 3/01* (2006.01)
*G06F 3/023* (2006.01)
*H03K 17/96* (2006.01)
*H01H 13/83* (2006.01)
*H01H 3/02* (2006.01)

(52) U.S. Cl.
CPC .............. *G06F 3/016* (2013.01); *G06F 3/0238* (2013.01); *H03K 17/9622* (2013.01); *H01H 13/83* (2013.01); *H01H 2003/0293* (2013.01); *H01H 2215/004* (2013.01); *H03K 2217/96062* (2013.01)

(58) Field of Classification Search
USPC ................................. 345/168–172, 173–178; 178/18.01–20.04
See application file for complete search history.

(56) References Cited

U.S. PATENT DOCUMENTS

| 6,680,677 | B1 | 1/2004 | Tiphane |
| 6,797,902 | B2 | 9/2004 | Farage et al. |
| 7,375,721 | B2 | 5/2008 | Muyskens et al. |
| 8,125,461 | B2* | 2/2012 | Weber et al. ................... 345/173 |
| 2004/0036632 | A1 | 2/2004 | Ford |
| 2004/0090399 | A1* | 5/2004 | Bal-Yona et al. ............... 345/76 |
| 2005/0068337 | A1 | 3/2005 | Duarte et al. |
| 2005/0110762 | A1* | 5/2005 | Muyskens et al. ............ 345/170 |
| 2006/0044279 | A1 | 3/2006 | Nasu et al. |
| 2007/0296702 | A1 | 12/2007 | Strawn et al. |
| 2008/0001787 | A1 | 1/2008 | Smith et al. |
| 2008/0309522 | A1 | 12/2008 | Larsen et al. |
| 2009/0210568 | A1 | 8/2009 | Peterson et al. |
| 2009/0231283 | A1* | 9/2009 | Polak et al. .................... 345/169 |
| 2010/0105443 | A1* | 4/2010 | Vaisanen ....................... 345/173 |

* cited by examiner

*Primary Examiner* — Ryan A Lubit (57) ABSTRACT

A versatile keyboard input and output device is described. The keyboard device includes a housing having a plurality of buttons, with each button individually clickable, and a capacitive sensing element under each button for touch sensing. The versatile keyboard input and output device further includes a lighting element under each button to provide selective lighting for each button, and a plurality of button glyphs for the plurality of buttons respectively, wherein the button glyphs are selectively visually changeable. The keyboard input device also includes a haptic feedback mechanism included in the housing for providing haptic feedback for the plurality of buttons.

12 Claims, 8 Drawing Sheets

KEYBOARD HAVING SELECTIVELY VIEWABLE GLYPHS

FIELD OF THE INVENTION

The present invention is generally related to electronic user input output devices.

BACKGROUND OF THE INVENTION

Gaming, or more particularly, electronic video gaming, is becoming increasingly popular with people of all ages. Generally speaking, video games involve interaction with a user interface to generate both visual and audible feedback on an electronic device. Modern video games also use other ways of providing interaction and information to the player, such as feedback via haptic peripherals, such as vibration or force feedback, with vibration sometimes used to simulate force feedback.

The electronic systems used to play video games are generally referred to as platforms. A platform refers to a specific combination of electronic or computer hardware which, in conjunction with certain software, operates the functionality of the video game. Example platforms include personal computers, video game consoles and portable or hand-held video devices. Such platforms range from large mainframe computers to small handheld devices (e.g., cell phones, etc.).

Video game consoles and certain types of handheld video devices typically use a specialized input device called a game controller. For example, one type of console game controller might consist of several buttons and one or more joysticks. Another type of game controller may feature a dozen buttons and one or more joysticks. Each console manufacturer typically implements their own specific game controller layout.

A PC game refers to a type of video game that is based on the utilization of a personal computer as its platform. The PC game typically involves a player interacting with a personal computer connected to a high-resolution screen (e.g., an external LCD monitor).

PC-based video games are generally more rich and complex than the other types of games, in many cases requiring very complex control systems built around the traditional mouse and keyboard paradigm. This is particularly true for MMO (massively multiplayer online) games and real-time strategy games. In these types of games, a keyboard is an indispensible control input for directional movement, complex menus, in-game shortcuts, and extra-game macros. Such functionality is very difficult to replicate using console game controllers and hand-held gaming devices.

A popular trend is providing rich and complex gameplay of PC-based videogames using more mobile platforms. As the gaming industry moves more towards satisfying this desire for more mobile platforms, a key obstacle has been continually encountered. This obstacle revolves around translating a full gaming keyboard experience into a small form factor. A typical laptop computer system may have a keyboard of sufficient size to enable an acceptable gaming experience, however most laptops are too large to be considered truly on-the-go mobile. Hence, the demand exists for mobile gaming devices that are even smaller than a typical laptop, but the obstacle remains. This obstacle is a tremendous challenge for many reasons.

For example, one reason relates to the fact that MMOs typically utilize the entire PC keyboard (including letters, numbers, F-keys, Page up, Page down, Tab, Escape, etc), and shrinking every function into a small portable form factor is both a mechanical challenge and a usability nightmare. Having too many buttons on a small device becomes very confusing to the user.

Another reason relates to the fact that small handheld to mid-sized keyboards are typically utilized with only two thumbs rather than a full ten fingers. This greatly changes the learned interaction between the player and the input, resulting in slower response times and a less satisfying gaming experience. For example, map keys used during games are typically configured under each finger of the left hand so that they can be quickly activated without looking (i.e., without taking your eyes off the screen). However, blindly activating all of those map keys only with your thumbs presents a much greater challenge.

Another reason relates to the fact that games designed for the PC often have small icons designed for PC monitors. Such icons can be, for example, for activating certain in game features, changing between modes, or the like. With a mouse on a large screen, these icons are simple to select and click. But on the small screen typically associated with a portable gaming platforms with a less-precise pointing device, selecting those icons is a greater chore.

Some portable gaming platforms have touch screen interfaces, which helps address the problems described above. However, virtual buttons on a touch screen still has drawbacks. These drawbacks include, for example, the fact that virtual buttons do not have the same tactile feedback as physical buttons (e.g., even with haptics). Virtual buttons are generally not accessible without taking your eyes off the play area of the screen and looking at them. Additionally, virtual buttons still require a relatively large screen to be effective since they require your fingers to occlude the screen.

SUMMARY OF THE INVENTION

Embodiments of the present invention implement a versatile and optimized keyboard device that greatly improves core aspects of user interaction design and physical design for a device that both accepts user input and provides user feedback. Embodiments of the present invention advantageously employ advanced touch-sensitive technology and light-enabling technology to greatly improve a user's keyboard experience.

In one embodiment, the present invention is implemented as a keyboard input/output device. The keyboard input/output device includes a housing having a plurality of buttons, with each button individually clickable, and a capacitive sensing element under each button for touch sensing. The keyboard input/output device further includes a lighting element (e.g., LEDs, etc.) under each button to provide selective lighting for each button, and a plurality of button glyphs for the plurality of buttons respectively, wherein the button glyphs are selectively visually changeable.

In one embodiment, each button is individually clickable via the actuation of an independent dome switch for each button. In one embodiment, the selective lighting for each button can be changed based upon an application, device, or keyboard context (e.g., operating mode, operating configuration, or the like).

In one embodiment, the haptic feedback mechanism provides haptic feedback localized to an individual button out of the plurality of buttons. Alternatively, the haptic feedback mechanism can provide haptic feedback localized to a set of buttons out of the plurality of buttons. As another alternative, the haptic feedback mechanism can provide haptic feedback to the housing (e.g., and thus the whole device) in substantially its entirety. In one embodiment, the housing is sized as a handheld device.

In another embodiment, the present invention is implemented as a keyboard input and output device having changeable glyphs for each button. The keyboard input output device includes a housing having a plurality of buttons, with each button individually clickable. Each of the buttons includes a semi-translucent surface film and a mask comprising a clear film screen having a plurality of opaque glyph negatives and disposed under the surface film. A transparent segmented LCD (liquid crystal display) layer is disposed under the mask. An electroluminescent backlight layer is disposed under the transparent segmented LCD layer. The transparent segmented LCD layer functions by selectively allowing light from the backlight layer to shine through one of the plurality of glyph negatives to implement visually changeable glyphs for each button.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Although the present invention has been described in connection with one embodiment, the invention is not intended to be limited to the specific forms set forth herein. On the contrary, it is intended to cover such alternatives, modifications, and equivalents as can be reasonably included within the scope of the invention as defined by the appended claims.

In the following detailed description, numerous specific details such as specific method orders, structures, elements, and connections have been set forth. It is to be understood however that these and other specific details need not be utilized to practice embodiments of the present invention. In other circumstances, well-known structures, elements, or connections have been omitted, or have not been described in particular detail in order to avoid unnecessarily obscuring this description.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "writing" or "storing" or "replicating" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

Embodiments of the present invention implement a versatile and optimized keyboard device that greatly improves core aspects of user interaction design and physical design for a device that both accepts user input and provides user output and feedback. Embodiments of the present invention advantageously employ advanced touch-sensitive technology and light-enabling technology to greatly improve a user's keyboard experience. It should be noted that although embodiments of the present invention specifically address the issues and problems surrounding playing complex games on a small device, embodiments may also be expanded to a number of different uses in tangential areas.

Figure 1:
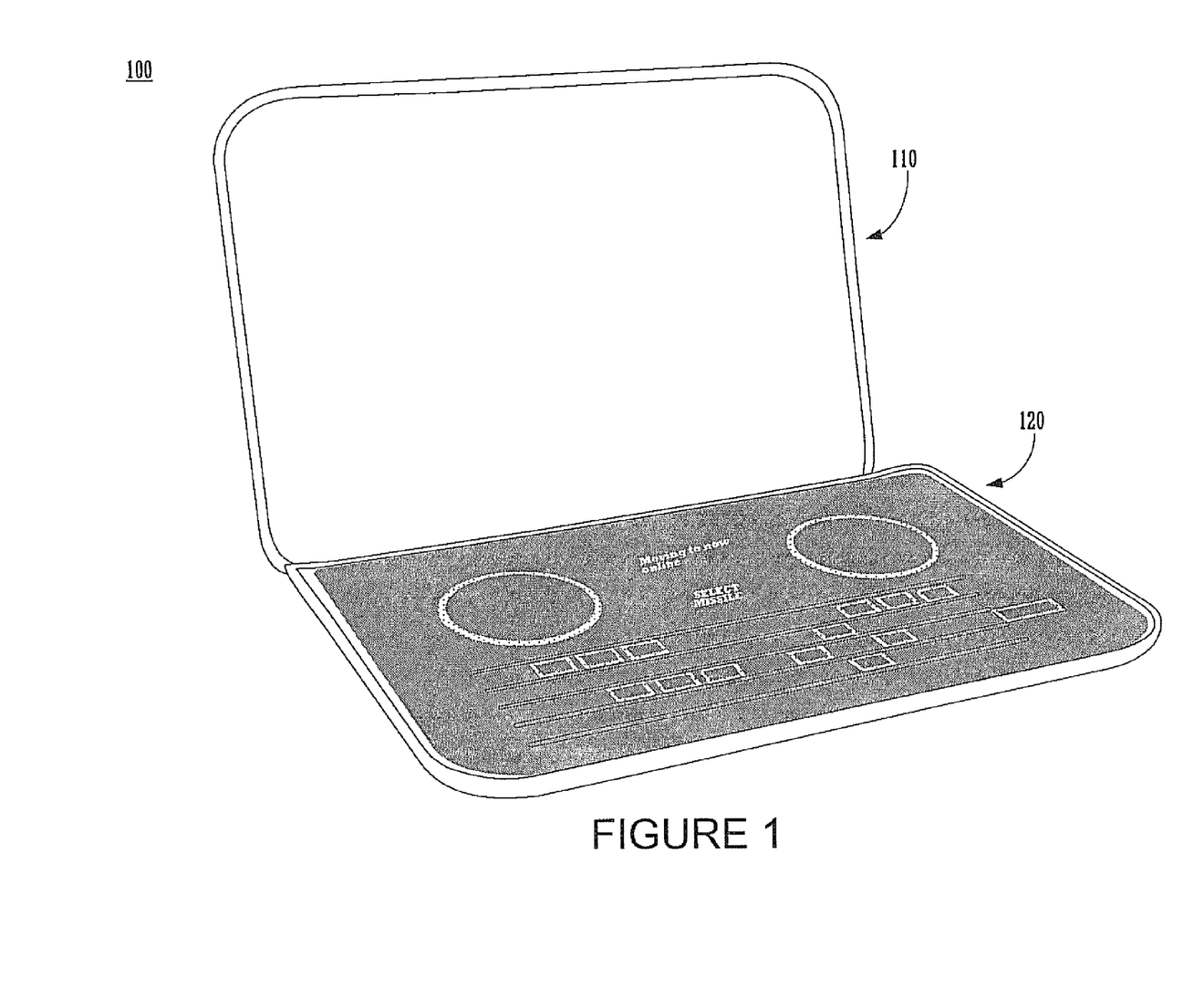
FIG. 1 shows a mobile computer system device having a versatile keyboard in accordance with one embodiment of the present invention.

FIG. 1 shows a mobile computing device 100 having a versatile keyboard in accordance with one embodiment of the present invention. As depicted in FIG. 1, the mobile computer system 100 comprises a display section 110 that is flexibly coupled to a body portion 120 (e.g., housing or chassis, etc.), which itself includes a versatile keyboard, the upper surface of which is visible, and a computer system (e.g., computer system 800 of FIG. 8) which provides the computer implemented functionality for executing games, applications, and the like.

The FIG. 1 embodiment shows aspects whereby a traditional laptop type device can be made smaller while still preserving the ability to play complex games. In the FIG. 1 embodiment, the versatile keyboard of the body portion 120, hereafter referred to simply as the versatile keyboard 120, includes a number of buttons as shown. Each button has been implemented to include a capacitive touch sensing capability via the inclusion of one or more touch sensing elements. The capacitive sensing under each button can be used for touch-detection. This touch-detection can produce pre-click feedback, gesture control, and other input functionality to the versatile keyboard. Each button has been implemented such that they are physically clickable (e.g., a physical movement associated with a user actuation). In one embodiment, individually clickable buttons are implemented via independent dome switches. Additionally, each button has been implemented to include individually light-able elements. This enables each individual button to be lit irrespective of the neighboring buttons. Each individual button can be lit in differing ways from neighboring buttons. In one embodiment, the lighting elements comprise LEDs (Light Emitting Diodes). The versatile keyboard 120 can implement haptic feedback in a manner that is localized to one or more specific keys, to a set of keys, or to the whole device. The haptic feedback is a separate user feedback from the physically clickable nature of the buttons.

In one embodiment, the button glyphs (symbols) that are on each of the buttons are implemented such that they can be visually changed. Such visual changes can indicate to a user a particular context of use or mode of operation. The ability to change button glyphs provides a user an intuitive manner to associate multiple functions with a given button, where each function is associated with a unique glyph.

The keyboard 120 embodiment solves a number of long-standing problems in comparison to conventional small device input mechanisms. For example, the individually clickable buttons of keyboard 120 solves issues supporting the complex game play interaction of complex videogames such as MMOs and real-time strategy games while using a small portable form factor. The clickable, physical buttons on the keyboard 120 are completely different than virtual buttons. Additionally, the clickable buttons do not consume any screen area and to not require the user to touch, and therefore occlude, the screen.

The keyboard 120 embodiment of FIG. 1 uses capacitive sensing under each button. The capacitive sensing, in conjunction with functionality that associates touch and click of individual buttons to, for example, icons and shortcuts in a game, greatly improves the usability of small handheld to midsized keyboards that are typically utilized with only two thumbs. As described above, the capacitive sensing under each button can be used for touch-detection. This touch detection can be used to produce a pre-click functionality. The pre-click functionality can be used to provide cues to the user as to which button they are getting ready to click. The cues provide a hint as to the action that will occur should the button actually be pressed. As such, the clickable buttons can be blindly actuated by a user, meaning the buttons can be actuated without the user taking her eyes off the play area of the screen 110 and looking at the buttons. The cues can be visual and shown on the screen 110, can be shown via lighting around individual button, can be audible via speakers of the device 100, or the like. In this manner, pre-click functionality can be used to assist the user in positioning her thumbs correctly over the desired button, thereby accelerating the learning process for becoming accustomed to the device 100 or applications running thereon.

Additionally, the pre-click functionality can assist with the user correctly highlighting and selecting small icons on the screen 110. As described above, complex videogames such as MMOs and real-time strategy games often have small icons designed for PC sized monitors. Such icons can be, for example, for activating certain in-game features, changing between modes, or the like. The pre-click functionality assists the user in correctly highlighting and selecting small icons on a comparatively smaller screens without requiring the use of a mouse. For example, a user can scan for the desired option by sliding her finger above the keyboard 120 buttons which activates the pre-click feature to indicate which items can be selected for each button.

The keyboard 120 embodiment includes individual lighting elements under every button. The individual lighting, in conjunction with the functionality that controls the lights to indicate active keys, greatly reduces the visual complexity of the keyboard. As described above, MMOs typically utilize the entire PC keyboard (including letters, numbers, F-keys, Page up, Page down, Tab, Escape, etc). The keyboard 120 advantageously provides substantially the entire PC keyboard without the confusion caused by a large number of buttons in a small form factor. For example, the individual lighting can quickly indicate to a user which keys are active in a particular mode (e.g., by visually indicating the perimeter only of buttons with active functions for the particular application being used). The user can quickly see the manner in which active keys change in conjunction with modes changing or application context changing. In one embodiment, the functionality that controls the lights to indicate active keys is software-based (e.g., implemented via a keyboard driver or device central processing unit etc.).

In one embodiment, different keyboard states can take place based on the current mode a key is in. States can include, for example, active and lit, inactive and lit, active and clicked, inactive and hover, active and touch, hover and then touch. An active button state can be one where pressing, hovering over, and/or touching the button will perform a related operation in software. For example, a button can be active touch but inactive click. In one embodiment, touching an active button will create one reaction on the screen, while clicking the same button will create a different reaction, while hovering over the same button will create yet another different reaction. A hover is the placement of a finger (or other object) relatively close to the button but not touching the button. The touch sensor can detect this proximate hover and the associated distance. Hover input can be used in many situations, including indicating pre-click feedback, in-air gesture inputs, hovering for a period of time, and hover plus press input types.

User actions can involve multiple keys and/or key regions. The glyphs in each key can block out individual sides of the key perimeter of the squares shown in FIG. 1. Thus, 4 keys can be lumped into one larger key region/larger key for certain uses. For example, children or elderly can be assisted playing games with bigger buttons. It would also apply to gamers who want the "arcade" feel of bigger buttons. Key regions can also represent other types and shapes of buttons. For example, lighting up (and making active) a d-pad and implementing d-pad type functionality, while the other areas around it are not clickable or have the touch turned off (inactive).

The keyboard 120 embodiment includes button glyph changing functionality whereby the button glyphs (symbols) that are on each of the buttons can be visually changed. The visual changes can indicate to a user a particular context of use or mode of operation. For example, switching from English language mode to Japanese or switching from letters mode to game-specific icon mode. The ability to change button glyphs provides a user intuitive manner to associate multiple functions with a given button, where each function is associated with a unique glyph. In this manner, the glyph changing functionality can reduce the number of buttons required to accomplish the similar number of functions on a full PC keyboard. Thus, a large number of buttons do not need to be crammed into the small space of a mobile keyboard. This aspect also helps reduce the visual complexity of the keyboard.

The keyboard 120 embodiment combines individually clickable buttons, reconfigurable button lighting, and specific button glyphs to improve point and select precision even though the user may be operating the keyboard 120 using only two thumbs. The improved point and select precision improves the learned interaction between the player and the input, thereby providing for faster response times and a more satisfying gaming experience. The improved point and select precision makes selecting small icons on the screen 110 more user-friendly. The improved point and select precision due to the combined individually clickable buttons and specific button glyphs allows for learning modes for new UIs (user interfaces).

In the keyboard 120 embodiment, in addition to solving existing problems, the combination of the features described above can provide a powerful toolkit for innovation in interaction design. Possibilities include (but are not limited to):
1) Drawing symbols on the keyboard to activate shortcuts or complex key entries (emoticons, foreign letter accents).
2) Controlling visual zoom on-screen utilizing gestures.
3) Capacitive slider controls.
4) 2-thumb capacitive key chording.
5) Quick key sequences for fighting games.
6) Dragging and dropping mapkeys to new button locations without using on-screen menus.
7) Keyboard-only games utilizing the button lighting for visual feedback.
8) All combinations of touch/click+d-pad/touchpad for shortcuts.
9) Increasing typing efficiency utilizing pre-click feedback on-screen.
10) Developer-driven direct game interfaces.
11) Learning modes by using lighting and/or haptic feedback for discovering and selecting shortcuts/specific assets.
12) Discovery of hidden features by haptic feedback to trigger click/illumination under a specific key.

In this manner, embodiments of the present invention combine clickable buttons, capacitive sensing, individual button lighting, and individually changeable button glyphs to implement a versatile and optimized keyboard device that greatly improves core aspects of user interaction design and physical design for a device that both accepts user input and provides user output/feedback. In one embodiment, certain aspects of the above described functionality are implemented via a software based keyboard driver that executes on the computer system within the keyboard 120 in conjunction with application software (e.g., computer system 800 in FIG. 8).

Figure 2:
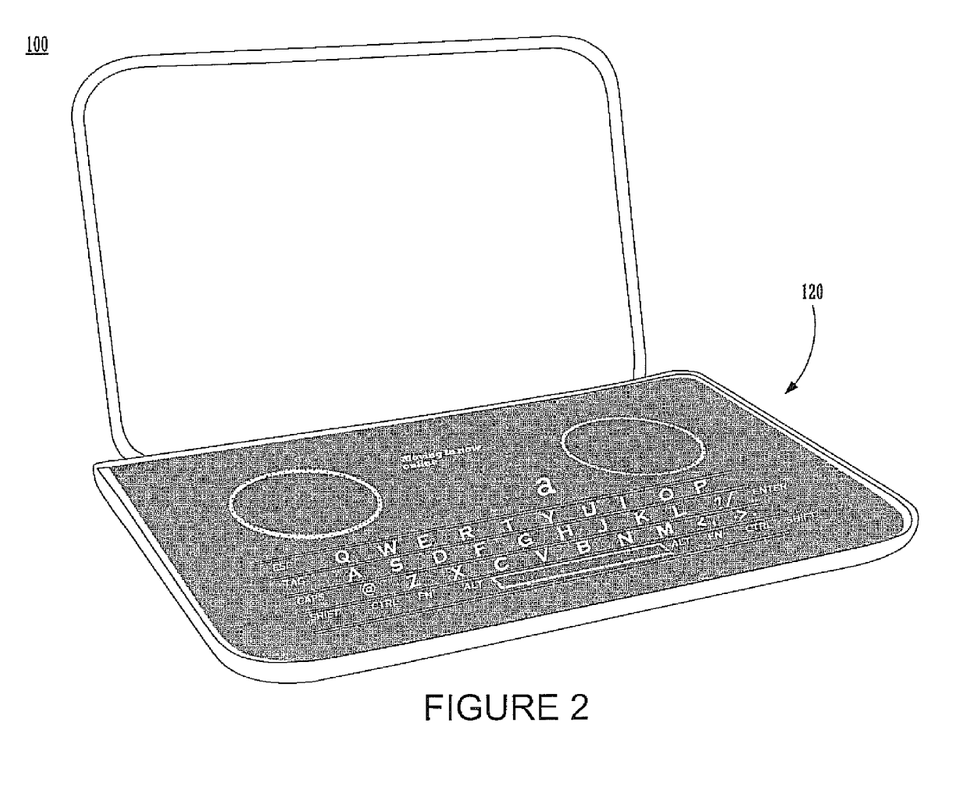
FIG. 2 shows the versatile keyboard in a first configuration in accordance with one embodiment of the present invention.
Figure 3:
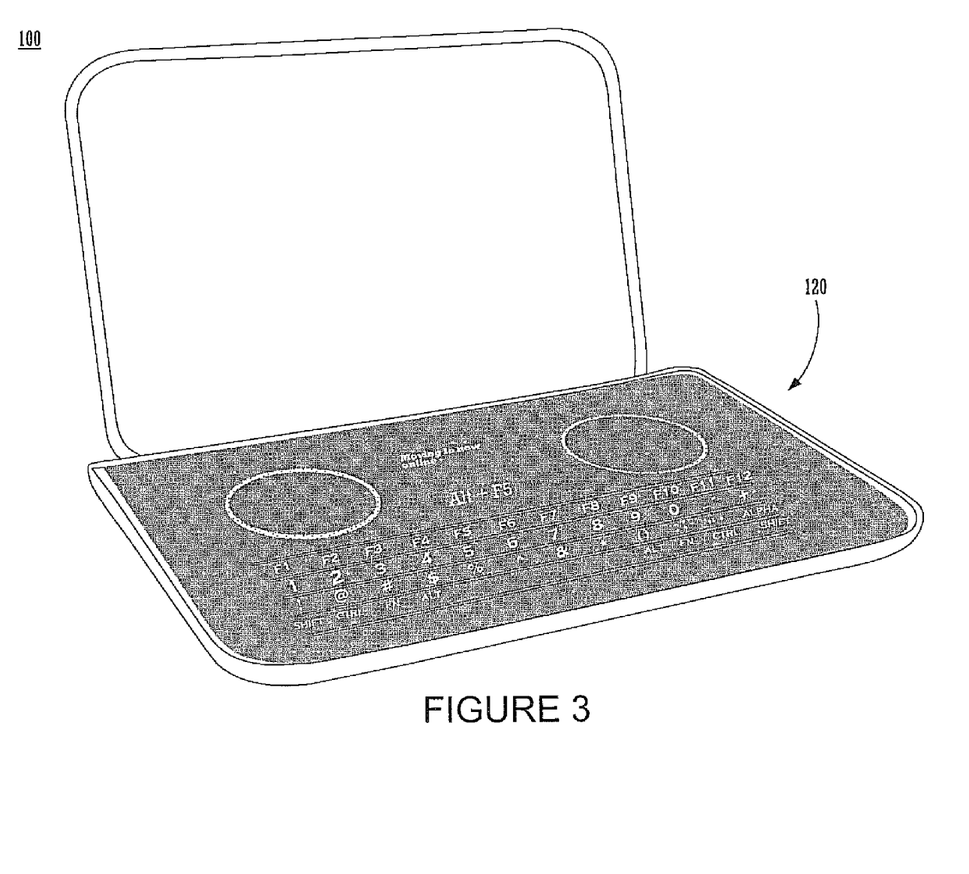
FIG. 3 shows the versatile keyboard in a second configuration in accordance with one embodiment of the present invention.

Referring now to FIG. 2 and FIG. 3, FIGS. 2 and 3 show the keyboard 120 implementing two different configurations in accordance with embodiments of the present invention. FIG. 2 shows the keyboard 120 in a first configuration. FIG. 3 shows the keyboard 120 in a second configuration.

As shown in FIG. 2 and FIG. 3, depending on a software context, the button glyphs of the keyboard 120 are able to change between letters, as shown in FIG. 2, and numbers, as shown in FIG. 3, on the same buttons. This allows for more functionality on fewer buttons without increasing visual complexity, as described above. In one embodiment, glyphs can be as many as can fit reasonably on the surface of a key, as well as the perimeter of the key as discussed above. Glyphs can include foreign language symbols or any other shape or design. Game publishers may also introduce glyph designs specific to their game, which may be loaded into the keyboard apparatus during setup. Each key has independent glyph control and can be set by a different software context. For example, the A/1 key could show an A and the S/2 key can show a 2 at the same time. This will be discussed further in reference to FIG. 6.

As described above, in one embodiment, the lighting also provides output to the user, making the versatile keyboard both an input and low-resolution output device. This is helpful, for example, in teaching students keyboard usage. Another usage example is playing the popular game nibbles just based on using the capacitive touch of the keyboard and the lighting feedback. Another usage example is to use the lighting on the keyboard in a music game mode where the lighting moves along the keyboard to indicate timing for certain gaming actions. Lights could also be a factor in playing a type of "battleship" game on the device. Thus, some games would not need a separate display screen at all for additional user output and feedback.

In one embodiment, the lighting can be projected in varying intensities as well. For example, the user can set the brightness similar to the brightness on a display screen, or the lighting can self adjust based on room conditions with an added light sensor. Thus, the lighting can blink and provide various other feedback to the user based on each individual buttons' intensity level. In one embodiment, the lighting can be of varying colors based on LED selections or filters placed above the LED. Glyph layouts can also affect the colors shown to the user.

Figure 4:
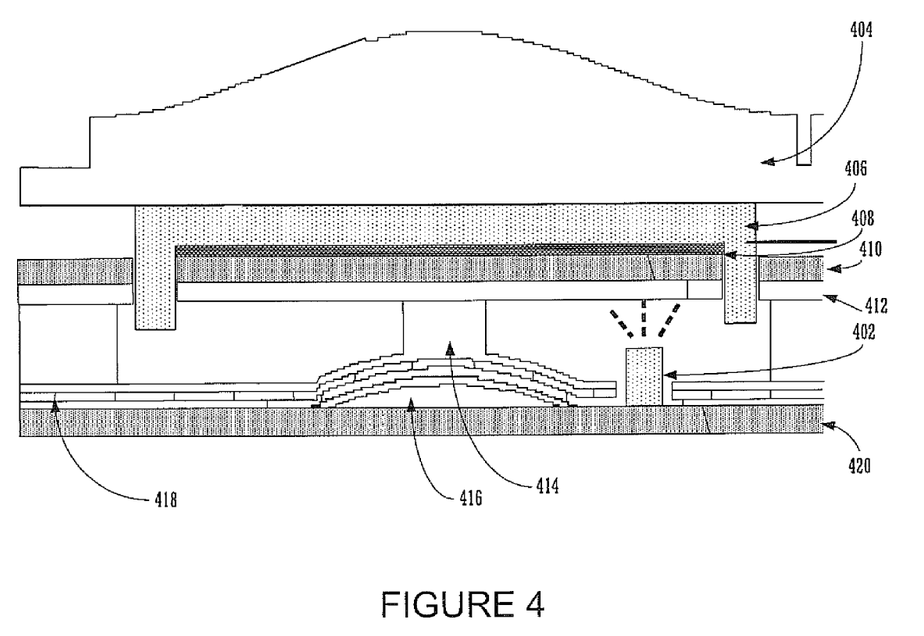
FIG. 4 shows an exemplary physical implementation of a button of a keyboard in accordance with one embodiment of the present invention.

FIG. 4 shows an exemplary physical implementation of a button of the keyboard 120 in accordance with one embodiment of the present invention. This implementation incorporates physical dome switches, individual button lighting, and a capacitive FPC (flexible printed circuit) into a single small device.

LED 402 provides the light for backlighting the glyphs and the sides of the buttons. The top of the button is a clear piece 404. Underneath that is the translucent light pipe 406. Adhesives 408 (e.g., alternatively color filters) attach the light pipe to a capacitive touch sensor layer 410. A reflective foil layer 412 is on the underside of the touch sensor layer 410. A nub 414 is connected to the reflective layer and is disposed over a dome switch 416 comprising a number of layers of laminate 418 and a PCB (printed circuit board) 420.

As shown in the FIG. 4 embodiment, the capacitive touch sensor below the surface of the key allows for touch actions with the keyboard. This allows for multi-touch functionality, gesture functionality, hover and touch functionality, pre-click feedback functionality, among others, in the manner described above. Depending upon the usage scenario, specific gestures applicable to gaming include the pan and zoom functions of moving around an in-game world. Other gestures can be used for changing the map-keys.

The capacitive touch component also brings together the possibility of pressure sensitivity on a touch of the device. This can detect pressure on the device as well as distance away from the device (e.g., as is used in providing pre-click functionality).

Pre-click functionality is a key component in gaming that the capacitive touch allows. For example, in one embodiment, users can hover their finger over a key to see on the screen which menu option or action will happen based on a click or a certain gesture. A menu can appear to the user on screen to give the user options as to what happens when they click, touch, slide right, slide left, hold for certain amount of time, etc. This allows for many types of gaming interactions to be improved upon and customized for the actual usage of users.

In another embodiment, haptic feedback can be provided to users based on the user's touch of a button. If a user touches a button and does not click on the button, the versatile keyboard 120 can provide haptic feedback to the user, thus providing feedback that the button was touched. Haptic feedback allows for improved implementation of gesture and touch precision relative to the capacitive touch sensing of the versatile keyboard 120.

Figure 5:
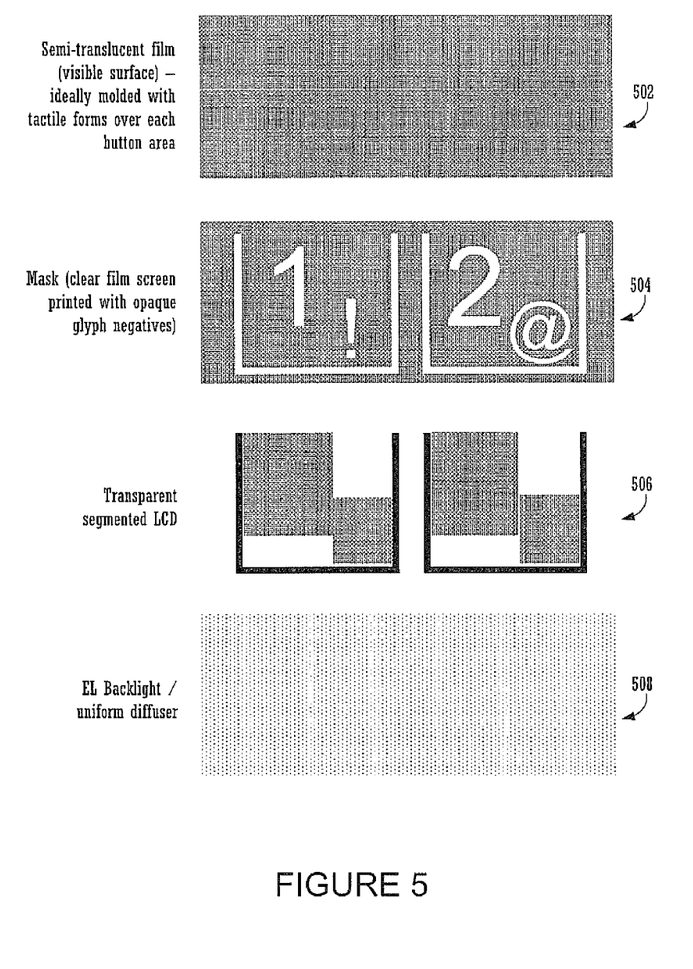
FIG. 5 shows an exemplary glyph changing implementation of buttons of a keyboard in accordance with one embodiment of the present invention.
Figure 6:
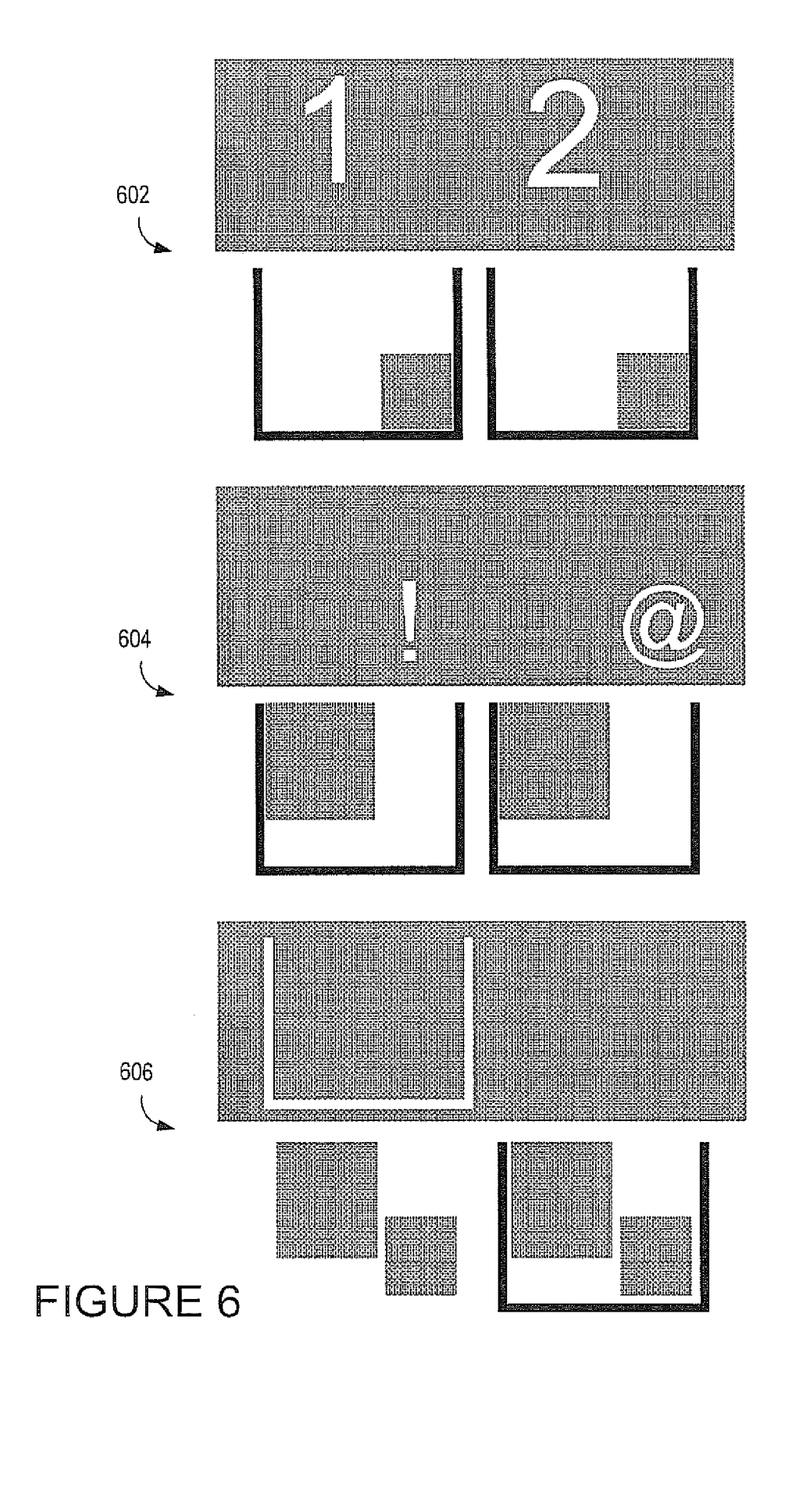
FIG. 6 shows a plurality of scenarios of backlighting and LCD segmentation to implement changeable glyphs in accordance with one embodiment of the present invention.

FIG. 5 shows an exemplary glyph changing implementation of a button of the keyboard 120 in accordance with one embodiment of the present invention. As shown in the FIG. 5 embodiment, the glyph changing functionality is implemented via use of multiple layered components. At the top resides a semi-translucent film 502. The film 502 is ideally molded with tactile forms over each button area. Underneath the film 502 is a mask 504. The mask 504 is typically a clear film screen printed with opaque glyph negatives, in this case, the outlines of a box, the numbers 1 and 2, and the symbols ! and @. Next is a transparent segmented LCD (liquid crystal display) layer 506. Underneath the LCD layer 506 resides an electroluminescent backlight and a uniform diffuser layer 508. The transparent segmented LCD layer 506 functions as a shutter, selectively allowing light from layer 508 shine through. This effect is shown in the discussion of FIG. 6 below. While the light from backlighting is helpful in viewing the glyphs, light is not required for the user to see which glyph is active.

As evident from FIG. 5, more than one glyph can be viewable at the same time. This allows for multiple glyph combinations active per key. For example, a glyph can have four sections and as the user solves a puzzle, the four individual glyph sections can become visible using the segmented LCD layer 506. Also, a user can see all the glyph options for a button in certain modes, for example, a configuration mode.

FIG. 6 shows a plurality of scenarios of backlighting and LCD segmentation to implement changeable glyphs in accordance with one embodiment of the present invention. In the first scenario 602, the LCD segments are shuttered as shown, such that light from the backlight can shine through to the 1 and the 2 glyphs as shown. In the second scenario 604, the LCD segments are shuttered as shown, such that light from the backlight can shine through to the symbols ! and @ as shown. In the third scenario 606, the LCD segments are shuttered as shown, such that light from the backlight can shine through to the outlines of a box as shown. Thus, FIG. 6 illustrates one implementation for implementing the changeable glyphs for each of the buttons of the keyboard 120.

Figure 7:
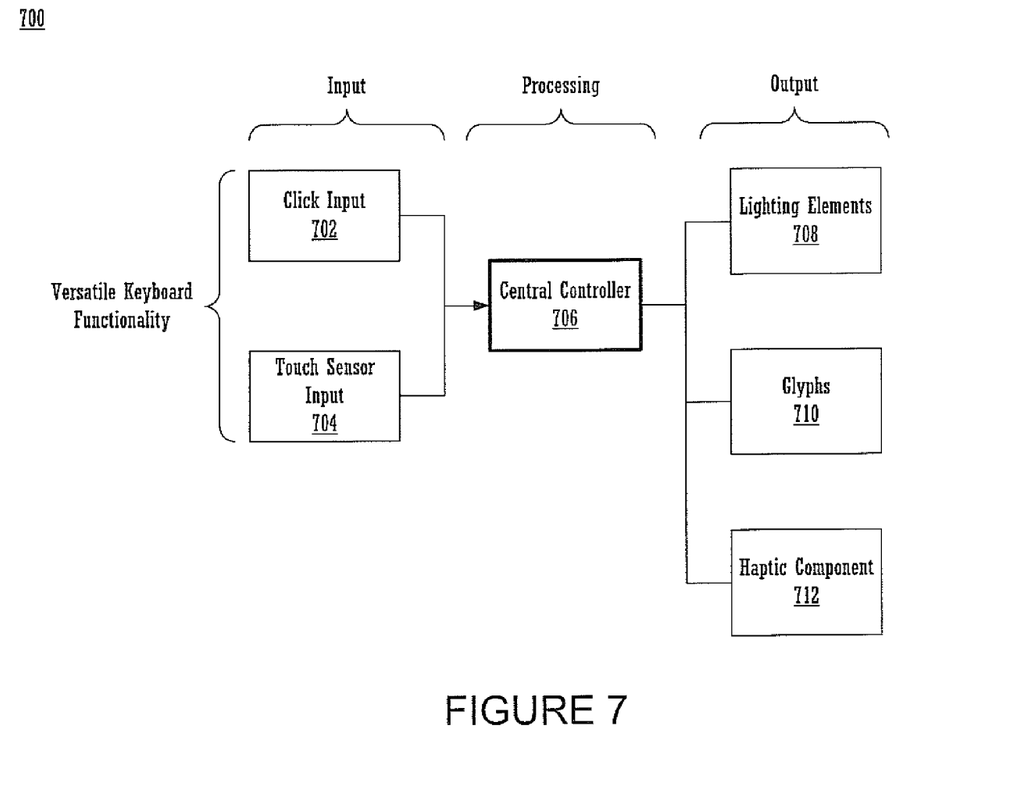
FIG. 7 shows certain components of an exemplary versatile keyboard system according to one embodiment of the present invention.

FIG. 7 shows certain components of an exemplary versatile keyboard system 700 according to one embodiment of the present invention. As depicted in FIG. 7, the versatile keyboard system 700 illustrates certain components 702-712 which implement aspects of both input functionality and output functionality of the keyboard apparatus. As shown in the FIG. 7 embodiment, the input aspects of the versatile keyboard functionality are implemented via the click input components 702 (e.g., the buttons of the keyboard device) and the touch sensor input components 704 (e.g., the capacitive touch sensing components under each button). The output aspects of the versatile keyboard functionality are implemented via the lighting elements 708, the glyphs 710 and one or more haptic components 712. As described above, the lighting elements 700 comprises the multiple light sources (e.g., LEDs) that illuminate each button and/or different portions of each button. The glyphs comprise the symbols which occupy each button and which can be independently changed. The haptic component 712 comprise one or more haptic feedback mechanisms which provide haptic feedback on a per button basis, for a group of buttons, or for the entire device as described above. The central controller 706 handles processing of both the input functionalities (e.g., components 702-704) and the output functionalities (e.g., components 708-712) of the keyboard system 700. The central controller 706 can be a controller within and specific to the versatile keyboard 700 or can be the controller of a larger computer system (e.g., a CPU).

Figure 8:
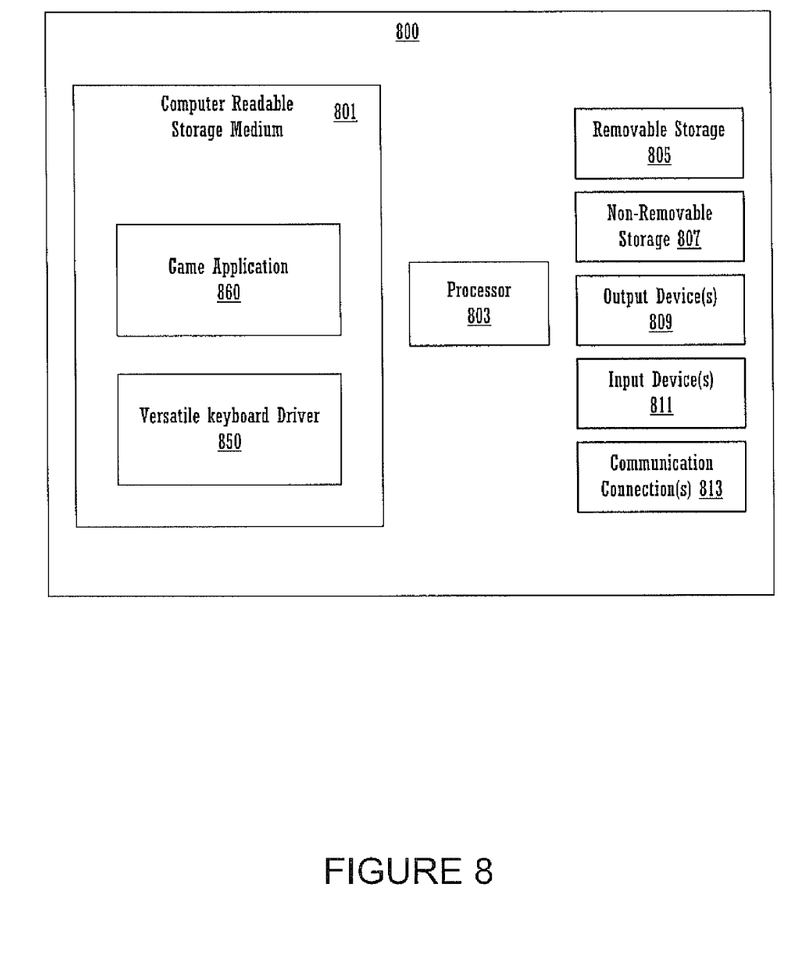
FIG. 8 shows an exemplary computer system according to one embodiment.

FIG. 8 shows an exemplary computer system 800 according to one embodiment. Computer system 800 depicts the components of a basic computer system providing the execution environment for certain hardware-based and software-based functionality for the above described embodiments. For example, computer system 800 can be a system upon which a versatile keyboard driver 850 and one or game applications 860 are instantiated. Computer system 800 can be implemented as, for example, a server computer system, workstation computer system, desktop computer system, or laptop computer system. Similarly, computer system 800 can be implemented as a mobile, handheld device. Computer system 800 typically includes at least some form of computer readable media (e.g., computer readable storage medium 801). Computer readable media can be a number of different types of available media that can be accessed by computer system 800 and can include, but is not limited to, computer storage media.

In its most basic configuration, computer system 800 typically includes processing unit 803 and a computer readable storage medium 801. Depending on the exact configuration and type of computer system 800 that is used, memory 801 can be volatile (e.g., such as DRAM, etc.) 801a, non-volatile 801b (e.g., such as ROM, flash memory, etc.) or some combination of the two. Similarly, the memory 801 can comprise other devices besides solid-state devices, such as, for example, magnetic disk-based media, optical media, or the like.

Additionally, computer system 800 can include other mass storage systems (e.g., removable 805 and/or non-removable 807) such as magnetic or optical disks or tape. Similarly, computer system 800 can include input devices 809 (e.g., such as the versatile keyboard 120) and/or output devices 811 including speakers, haptic feedback components, lights, vibration motors, a display (e.g., such as a display 110) and the like. Computer system 800 can further include network and communications connections 813 to other devices, computers, networks, servers, etc. using either wired or wireless media.

Many other devices or subsystems (not shown) may be connected in a similar manner (e.g., document scanners, digital cameras and so on). Conversely, all of the devices shown in FIG. 8 need not be present to practice the present invention. The devices and subsystems can be interconnected in different ways from that shown in FIG. 8. The operation of a computer system such as that shown in FIG. 8 is readily known in the art and is not discussed in detail in this application. Code to implement the present disclosure can be stored in computer-readable storage media such as one or more of system memory, fixed disk, optical disk, or floppy disk. The operating system provided on computer system 800 may be MS-DOS®, MS-WINDOWS®, OS/2®, UNIX®, Linux®, or another known operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present disclosure may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing description, for the purpose of explanation, has been described with reference to specific embodiments. However, the illustrated discussions above are not intended to be exhaustive or to limit the invention to the precise forms disclosed. Many modifications and variations are possible in view of the above teachings. Embodiments were chosen and described in order to best explain the principles of the invention and its practical applications, to thereby enable others skilled in the art to best utilize the invention and various embodiments with various modifications as may be suited to the particular use contemplated.

What is claimed is:

1. A keyboard input and output device, comprising:
    a housing having a plurality of physical buttons, with each button of the physical buttons individually clickable, and wherein each button of the physical buttons comprises:
        a semi-translucent surface film;
        a clear film screen disposed under the surface film having a plurality of opaque glyph negatives disposed thereon, the glyph negatives comprising a first glyph negative and a second glyph negative;
    a segmented LCD (liquid crystal display) layer disposed under the clear film screen configured to transmit light through the clear film screen;
    an electroluminescent backlight layer disposed under the segmented LCD layer, the segmented LCD layer comprising a first segment between the backlight layer and the first glyph negative, a second segment between the backlight layer and the second glyph negative, and a third segment between the backlight layer and the perimeter of the button, wherein the first segment and the second segment can be shuttered and unshuttered so that the first glyph negative and the second glyph negative, respectively, are not lit and are lit, respectively; wherein further the third segment is shuttered and unshuttered so that the perimeter of the button is unlit and lit, respectively, wherein the perimeter of the button is lit when the button is active when a first application is being used and unlit when the button is inactive when a second application is being used.

2. The device of claim 1, wherein touching the button creates a first reaction, clicking the button creates a second reaction, and hovering over the button without contacting the button creates a third reaction.

3. The device of claim 1, wherein the housing is sized as a handheld device.

4. The device of claim 1, further comprising:
    a haptic feedback mechanism included in the housing for providing haptic feedback for the plurality of buttons;
    wherein the haptic feedback mechanism provides haptic feedback localized to an individual button of the plurality of buttons.

5. The device of claim 4, wherein the haptic feedback mechanism provides haptic feedback in response to a touch sensing detection by a capacitive sensing element.

6. The device of claim 1, wherein a portion of the perimeter of the button is lit while another portion of the perimeter of the button is unlit, and a portion of the perimeter of an adjacent button is also lit while another portion of the adjacent button is unlit, so that the portion of the perimeter of the button and the portion of the perimeter of the adjacent button that are lit form a perimeter around the button and the adjacent button so they appear as a single larger button, the button and the adjacent button also functioning as a single button.

7. The device of claim 6, wherein the button and the adjacent button comprise at least a part of a larger d-pad shaped button having a d-pad function.

8. The device of claim 1, wherein each of the buttons provides a gesture input functionality.

9. The device of claim 2, wherein the third reaction implements a reaction indicated by a pre-click function that specifies a reaction that results when the button is selected.

10. The device of claim 2, wherein the second reaction implements a reaction previously indicated in response to a pre-click function that specifies a reaction that results when the button is selected.

11. The device of claim 1, coupled to a display screen, wherein the button is configured to detect touch; wherein in response to the button being touched but before the button is clicked, a cue identifying the button is displayed on the display screen.

12. The device of claim 11, wherein the cue further identifies an action that will be performed when the button is clicked.

* * * * *